(12) United States Patent
Hudait et al.

(10) Patent No.: US 7,566,898 B2
(45) Date of Patent: Jul. 28, 2009

(54) BUFFER ARCHITECTURE FORMED ON A SEMICONDUCTOR WAFER

(75) Inventors: Mantu K. Hudait, Portland, OR (US); Dmitri Loubychev, Bethlehem, PA (US); Suman Datta, Beaverton, OR (US); Robert Chau, Beaverton, OR (US); Joel M. Fastenau, Bethlehem, PA (US); Amy W. K. Liu, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 223 days.

(21) Appl. No.: 11/712,614

(22) Filed: Mar. 1, 2007

(65) Prior Publication Data

US 2008/0210927 A1     Sep. 4, 2008

(51) Int. Cl.
    *H01L 31/00*     (2006.01)
(52) U.S. Cl. .................. 257/24; 257/194; 257/195; 257/E21.403; 438/590
(58) Field of Classification Search .............. None
    See application file for complete search history.

(56) References Cited

U.S. PATENT DOCUMENTS 5,719,895 A * 2/1998 Jewell et al. ........... 372/45.012
5,847,409 A * 12/1998 Nakayama .................. 257/15

OTHER PUBLICATIONS

U.S. Appl. No. 11/498,685, filed Aug. 2, 2006, entitled "Semiconductor Buffer Architecture For III-V Devices On Silicon Substrates," by Mantu K. Hudait, et al.
U.S. Appl. No. 11/501,253, filed Aug. 2, 2006, entitled "Dislocation-Free INSB Quantum Well Structure On SI Using Novel Buffer Architecture," by Mantu K. Hudait, et al.
U.S. Appl. No. 11/527,785, filed Sep. 27, 2006, entitled "Buffer Layers For Device Isolation Of Devices Grown On Silicon," by Mantu K. Hudait, et al.

* cited by examiner

*Primary Examiner*—Evan Pert
*Assistant Examiner*—Scott R Wilson
(74) *Attorney, Agent, or Firm*—Trop, Pruner & Hu, P.C.

(57) ABSTRACT

In one embodiment, the present invention includes an apparatus for forming a transistor that includes a silicon (Si) substrate, a dislocation filtering buffer formed over the Si substrate having a first buffer layer including gallium arsenide (GaAs) nucleation and buffer layers and a second buffer layer including a graded indium aluminium arsenide (InAlAs) buffer layer, a lower barrier layer formed on the second buffer layer formed of InAlAs, and a strained quantum well (QW) layer formed on the lower barrier layer of indium gallium arsenide (InGaAs). Other embodiments are described and claimed.

14 Claims, 3 Drawing Sheets

BUFFER ARCHITECTURE FORMED ON A SEMICONDUCTOR WAFER

BACKGROUND

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as complementary metal oxide semiconductor (CMOS) and quantum well (QW) transistors fabricated from extreme high mobility materials such as, but not limited to, indium antimonide (InSb), indium gallium arsenide (InGaAs) and indium arsenide (InAs).

Despite all these advantages, the growth of III-V materials upon silicon substrates presents many challenges. Crystal defects are generated by lattice mismatch, polar-on-nonpolar mismatch and thermal mismatch between the III-V semiconductor epitaxial layer and the silicon semiconductor substrate. Such mismatch can lead to poor electrical characteristics such as low carrier mobility and high leakage. When the lattice mismatch between the epitaxial layer and substrate exceeds a few percent, the strain induced by the mismatch becomes too great and defects are generated in the epitaxial layer when the epitaxial film relaxes the lattice mismatch strain. Many defects, such as threading dislocations and twins, tend to propagate into the "device layer" where the semiconductor device is fabricated.

DETAILED DESCRIPTION

In various embodiments, indium gallium arsenide (InGaAs)-based semiconductor devices may be formed on a silicon (Si) substrate. Using such an InGaAs-based structure, high speed and low power performance can be realized. To enable such architectures, embodiments may provide a buffer layer design to bridge material mismatch issues between an active InGaAs channel layer and the underlying Si substrate. In some implementations, a buffer design may be a dual layer including a gallium arsenide (GaAs) layer grown on the Si substrate, followed by a graded indium aluminium arsenide (InAlAs) or indium gallium aluminium arsenide (InGaAlAs) layer formed on the GaAs layer.

Such a buffer layer may serve several purposes. This buffer layer may bridge lattice constants between a substrate and a channel layer formed thereon. Furthermore, the buffer layer may provide compressive strain for carrier confinement inside a quantum well (QW) of the channel layer and may further serve as a bottom barrier to the channel layer. Still further, the buffer may provide large band offset between this bottom barrier and the channel layer, as well as provide device isolation and eliminate parallel conduction from the buffer layer to the channel layer due to the large bandgap. Accordingly, high structural and electrical quality InGaAs-based devices may be formed on a Si substrate.

Figure 1:
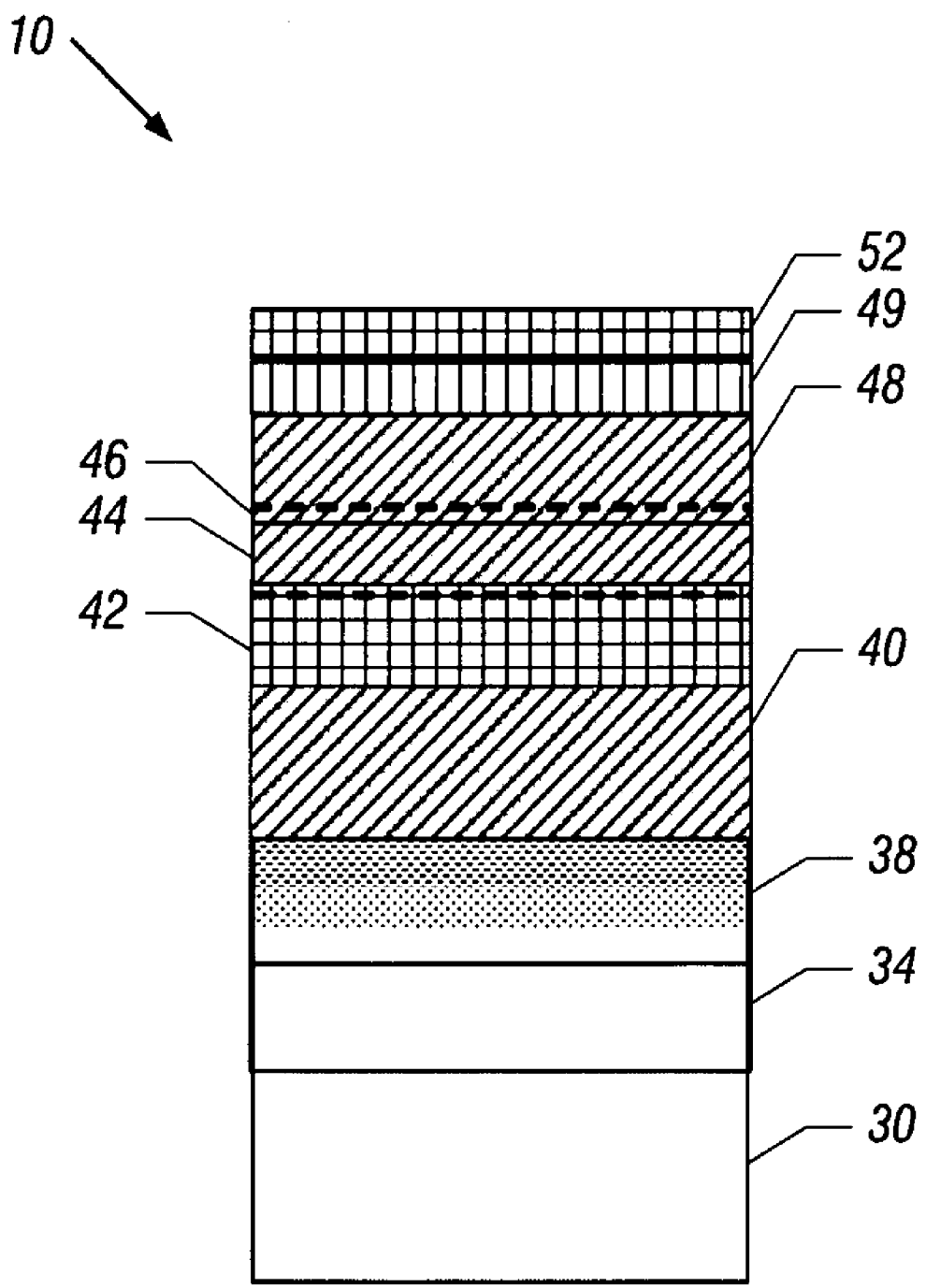
FIG. 1 is a cross section view of a device structure in accordance with an embodiment of the present invention.

Referring now to FIG. 1, shown is a cross section view of a device structure 10 in accordance with an embodiment of the present invention. As shown in FIG. 1, structure 10 may be used to form an NMOS or PMOS device on a substrate 30. In various embodiments, substrate 30 may be a high resistivity n or p-type (100) off-oriented Si substrate, although the scope of the present invention is not limited in this regard. Substrate 30 may have a vicinal surface prepared by off-cutting the substrate from an ingot. The (100) substrate 30 may be off cut at an angle between 2 and 8 degrees towards the (110) direction to produce a surface having terraces in one embodiment. In other embodiments, other off cut orientations or a substrate without an off cut may be used. Such a high resistivity substrate may provide for device isolation. Furthermore, off-cutting may eliminate anti-phase domains in anti-phase boundaries.

As shown in FIG. 1, next a nucleation and buffer layer (hereafter nucleation layer) 34 may be formed on substrate 30. In various embodiments, nucleation layer 34 may be a GaAs layer. Nucleation layer 34 may be formed via a metal organic chemical vapor deposition (MOCVD) or molecular beam epitaxy (MBE), or another such process. Nucleation layer 34 may be used to thus fill the lowest silicon substrate terraces with atomic bi-layers of the GaAs material. The nucleation layer portion of nucleation layer 34 may create an anti-phase domain-free "virtual polar" substrate. In some embodiments, this portion of layer 34 may be between approximately 30 angstroms (Å)-500 Å. In some embodiments, MBE may be performed at temperatures between approximately 400° Celsius (C.)-500° C. The buffer layer portion of nucleation layer 34 may provide for gliding dislocation and control of the lattice mismatch of between approximately 4% to 8% between Si and a barrier layer to be formed over nucleation layer 34. In some embodiments, the buffer portion of layer 34 may be formed at a higher temperature than the nucleation portion and may be relatively thicker in some embodiments. Buffer layer 34 may be between approximately 0.3 microns (μm) and 5.0 μm, in some embodiments.

Referring still to FIG. 1, another buffer layer 38 may be formed over buffer layer 36. In various embodiments, buffer layer 38 may be an indium aluminium arsenide ($In_xAl_{1-x}As$) material and may be graded in accordance with an embodiment of the present invention. By forming of a graded buffer layer, dislocations may glide along relatively diagonal planes within the graded buffer layer. Buffer layer 38 may be between approximately 0.5 and 2.0 microns in some embodiments. Together, nucleation layer 34 and buffer layer 38 may form a dislocation filtering buffer. This buffer may provide compressive strain for an InGaAs quantum well (QW) structure. Furthermore, these layers may control lattice mismatch of about approximately 4% to minimize threading dislocations. In some implementations, buffer layer 38 may be inverse step graded InAlAs or indium gallium aluminium arsenide (InGaAlAs) in order to have a larger bandgap for device isolation. Furthermore, depending upon Al percentage, strain to a quantum well layer to be formed thereon can be modulated. Buffer layer 38 may further provide for strain relaxation.

A lower barrier layer 40 may be found on the dislocation filtering buffer. Lower barrier layer 40 may be formed of a higher bandgap material than a quantum well layer to be formed thereon. Lower barrier layer 40 may be of sufficient thickness to provide a potential barrier to charge carriers in the transistor stack. In one embodiment, lower barrier layer 40 may have a thickness of between approximately 100 Å-250 Å. In other embodiments, lower barrier layer may be between approximately 2-5 μm.

Referring still to FIG. 1, a quantum well layer 42 may be formed over lower barrier layer 40. Quantum well layer 42 may be formed of a material having a smaller bandgap than that of lower barrier layer 40. In one embodiment, quantum well layer 42 may be formed of $In_xGa_{1-x}As$, where x equals between approximately 0.53-0.8. Quantum well layer 42 may be of sufficient thickness to provide adequate channel conductance. In some embodiments, quantum well layer 42 may be between approximately 10-50 nanometers (nm). Quantum well layer 42 may provide high electron mobility and velocity for NMOS devices, and also may provide high hole mobility and velocity for PMOS devices, both compared to a Si-based device.

As further shown in FIG. 1, a spacer layer 44 may be formed over quantum well layer 42. Spacer layer 44 may be an $In_xAl_{1-x}As$ or InAlAs spacer layer. Spacer layer 44 may provide for carrier confinement and reduced interaction between a doping layer and a two dimensional electron gas (2DEG) formed inside the channel (i.e., the channel of quantum well layer 42). Still further, spacer layer 44 may provide compressive strain to the channel. In various embodiments, spacer layer 44 may be approximately 20 Å to 30 Å thick.

A doping layer may be formed over spacer layer 44. Doping layer 46 may be delta-doped, modulation doped and/or combinations thereof. For example, in one embodiment doping layer 46 may be a Si modulation delta-doped layer having a thickness of approximately 3 Å-5 Å. For an NMOS device, doping may be implemented using Si and teryllium (Te) impurities. As for a PMOS device, doping may be beryllium (Be) or carbon (C).

Referring still to FIG. 1, an upper barrier layer 48 may be formed over doping layer 46 to complete the device stack or layer. In one embodiment, barrier layer 48 may be an $In_xAl_{1-x}As$ barrier layer. Barrier layer 48 may have a thickness of between approximately 50 Å-500 Å, and may be a Schottky barrier layer for gate control. An etch stop layer 49 may be formed over upper barrier layer 48, and may be indium phosphide (InP) in some embodiments.

As further shown in FIG. 1, a contact layer 52 may be present to act as a contact layer to provide source and drain contacts with low contact resistance and may be formed of $In_xGa_{1-x}As$, in various embodiments. For an NMOS device, contact layer 52 may be n+doped, while for a PMOS device, contact layer 52 may be p+doped. Contact layer 52 may be between approximately 30 Å-300 Å thick.

While not shown in FIG. 1, a fully completed device may further include source and drain electrodes. Furthermore, a dielectric material may be formed on barrier layer 48 over which a gate electrode may be formed. Note that a gate recess etch may be performed within upper barrier layer 48 to form a gate recess on which the dielectric layer and gate electrode may be formed. Thus a Schottky junction may be formed through which gate electrode 58 may control quantum well layer 42.

Accordingly, in various embodiments devices may be formed using a high electron mobility material to form high electron mobility transistors (HEMTs) having high speed and low power consumption. Such devices may have dimensions less than approximately 50 nm with a switching frequency of approximately 562 gigahertz (GHz). Such devices may be able to operate at between approximately 0.5-1.0 volts without significant reduction of drive current. Furthermore, embodiments may provide lower gate delay at a gate length than a silicon based device.

Figure 2:
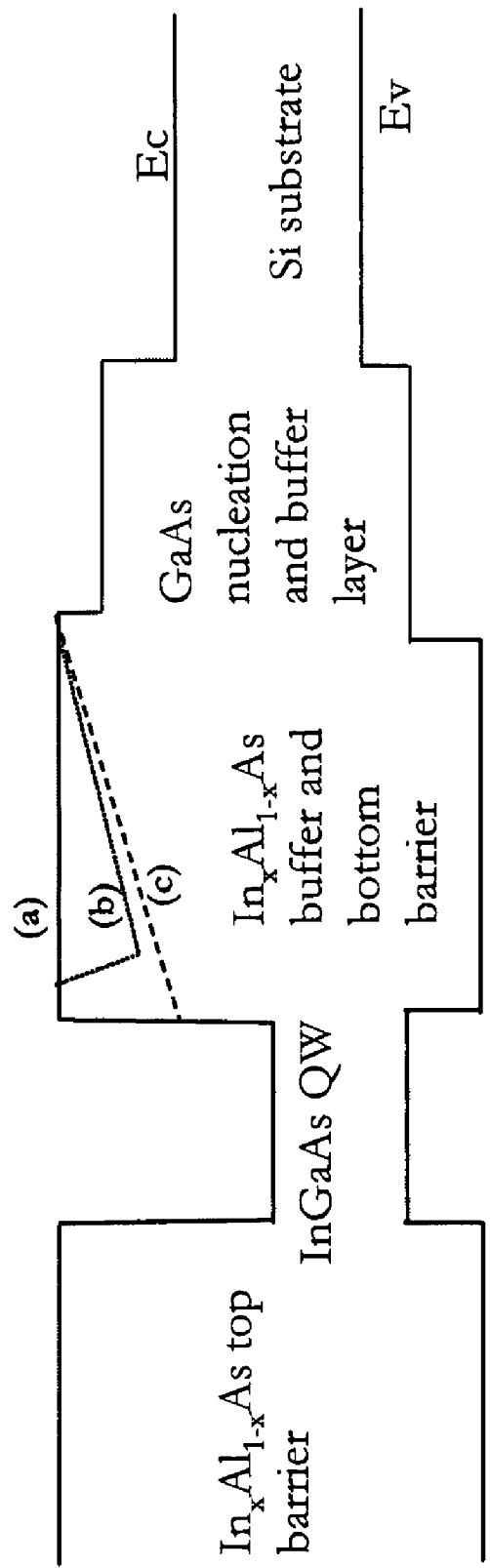
FIG. 2 is a band diagram of a structure in accordance with an embodiment of the present invention.

Referring now to FIG. 2, shown is a band diagram of a structure in accordance with an embodiment of the present invention. As shown in FIG. 2, the band diagram illustrates, via the top line a conduction band (i.e., $E_C$) and via the lower line a valence band (i.e., $E_V$). Beginning at the right-hand side of FIG. 2, a Si substrate on which a device stack is formed may have a band gap of approximately 1.1 electron volts (eV). Over the Si substrate, a nucleation and buffer layer may be formed, e.g., of GaAs. As shown, these layers have a higher band gap, e.g., approximately 1.42 eV. Then, a buffer layer and bottom barrier layer may be formed, e.g., of indium aluminium arsenide, to draw a suitable balance between carrier confinement for a channel structure formed in a quantum well layer and relaxation.

Note that three different possible paths, namely paths A, B and C are possible paths of this buffer layer to provide compressive strain to a quantum well layer formed thereon. Path A, which may correspond to a band gap of approximately 1.5 eV, may be obtained by providing buffer and barrier layers having an indium concentration of approximately 52%, namely $In_{0.52}Al_{0.48}As$. While such layer formation may provide for suitable carrier confinement characteristics, the difference in lattice constants between this type of layer and the underlying substrate may lead to a lattice constant mismatch and thus defects at the interface. Instead, path C shown with a dashed line, which may have relatively poor carrier confinement characteristics, provides a reduced lattice constant mismatch to avoid defects. For path C, a linearly increasing indium concentration from approximately 0% (i.e., AlAs) to approximately 70% indium (i.e., $In_{0.70}Al_{0.30}As$) may be present. In this case, the In composition in the graded $In_xAl_{1-x}As$ or InGaAlAs buffer is same as the In composition in the $In_xGa_{1-x}As$ channel formed above it, so that the channel is unstrained with respect to bottom barrier. Although the defect is less inside the QW layer, the carrier confinement is poor due to low valence band offset between $In_xAl_{1-x}As$ (e.g., x=0.7) bottom barrier and $In_xGa_{1-x}As$ (e.g., x=0.7) channel as well as not taking the advantage of the strain in the quantum well.

To achieve benefits of both carrier confinement and a relaxation characteristic that provides for a nearly fully relaxed (i.e., metamorphic) structure, path B (shown in FIG. 2 as the dotted line) may be implemented. In this implementation, the barrier layer may be formed with an inverse grading with an indium concentration, x, varying from 0% at the interface with the GaAs nucleation and buffer layer up to an amount of x equal to approximately 62% or 63%, and then reducing the x amount back to approximately 52%, as shown in path B. In this way, suitable carrier confinement can be realized while providing a substantially metamorphic profile.

Referring still to FIG. 2 over this bottom barrier layer a QW layer may be formed with a relatively small band gap. Specifically, in one embodiment, a QW layer may be formed of indium gallium arsenide with x equal to 0.7 (i.e., $In_{0.7}Ga_{0.3}As$) such that the band gap is approximately 0.6 eV. To provide further compressive strain to this QW structure, a top barrier may be formed of indium aluminium arsenide having x equal to approximately 52% (i.e., $In_{0.52}Al_{0.48}As$), corresponding to a band gap of approximately 1.5 eV.

Figure 3:
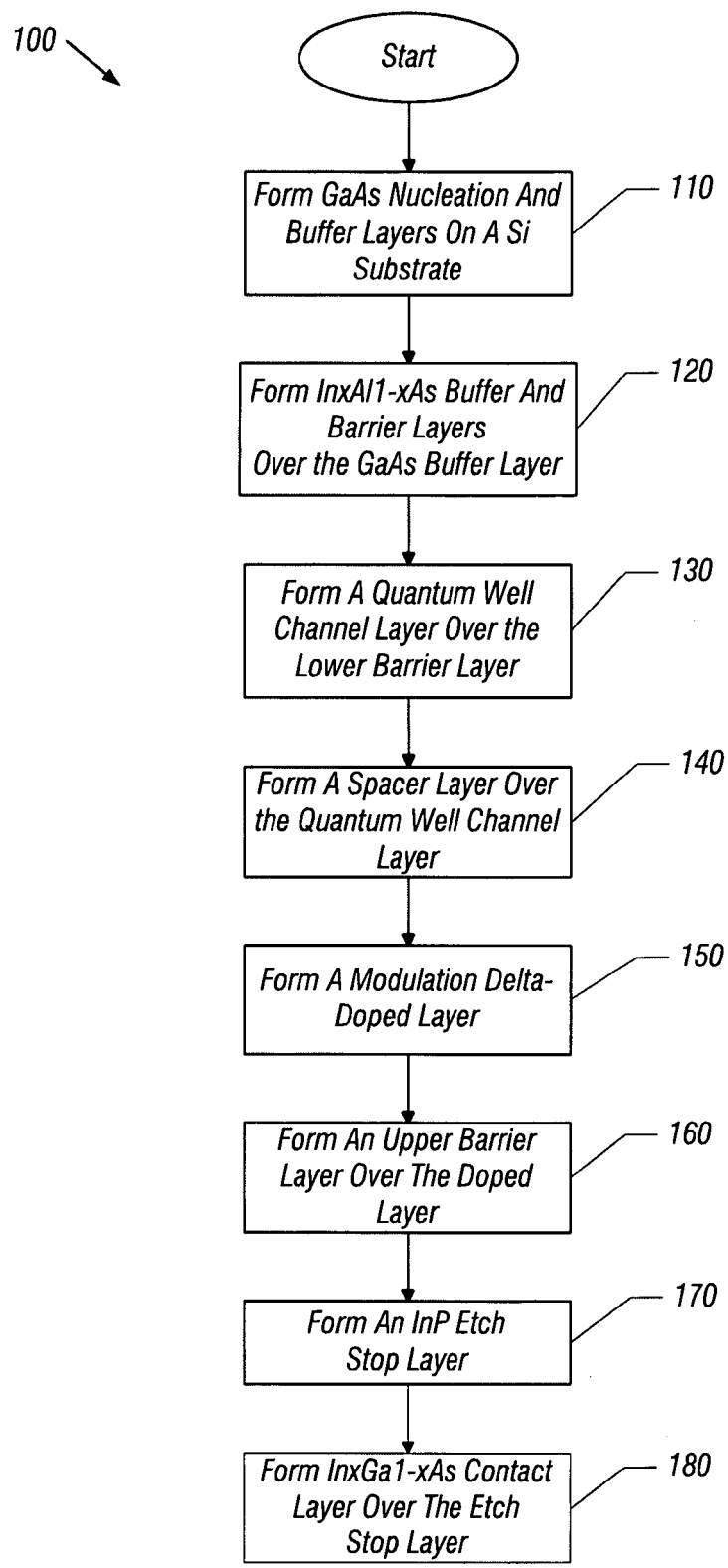
FIG. 3 is a flow diagram of a method in accordance with an embodiment of the present invention.

Referring now to FIG. 3, shown is a flow diagram of a method in accordance with an embodiment of the present invention. As shown in FIG. 3, method 100 may begin by forming GaAs nucleation and buffer layers over a Si substrate (block 110). Next, $In_xAl_{1-x}As$ buffer and barrier layers may be formed over the GaAs buffer layer (block 120). As described above, in some embodiments the buffer layer may be inverse step graded. Together the GaAs and $In_xAl_{1-x}As$ layers may form a dislocation filtering buffer. Next, a QW channel layer, which may be formed of $In_xGa_{1-x}As$, is formed over the lower barrier layer (block 130). Then a spacer layer may be formed over the quantum well (QW) channel layer (block 140). Next, a modulation delta-doped layer may be formed (block 150). To complete the device stack, an upper barrier layer, formed of $In_xAl_{1-x}As$, may be formed over the doped layer (block 160). Then an InP etch stop layer may be formed (block 170), and a contact layer formed of $In_xGa_{1-x}As$ over the etch stop layer (block 180). Of course, from this contact layer, source and drains of a device may be formed, and further a gate electrode may be formed on a dielectric layer formed over the contact layer. While shown with this particular implementation in the embodiment of FIG. 3, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a silicon (Si) substrate;
    a dislocation filtering buffer formed over the Si substrate, the dislocation filtering buffer including:
        a first buffer layer including a gallium arsenide (GaAs) nucleation layer and a GaAs buffer layer; and
        a second buffer layer formed on the first buffer layer, the second buffer layer comprising a graded indium aluminium arsenide (InAlAs) buffer layer;
    a lower barrier layer formed on the second buffer layer, the lower barrier layer formed of InAlAs or indium gallium aluminium arsenide (InGaAlAs), wherein the second buffer layer is formed of aluminium arsenide (AlAs) at an interface with the first buffer layer and is graded with increasing concentration of indium (In) to obtain an In concentration of at least approximately 60%, and is then inverse graded with decreasing concentration of In to attain an In concentration of approximately 52% at an interface with the lower barrier layer;
    a quantum well (QW) layer formed on the lower barrier layer, wherein the quantum well layer comprises a strained layer formed of indium gallium arsenide (InGaAs);
    a spacer layer formed over the quantum well layer;
    a delta-doped layer formed over the spacer layer; and
    an upper barrier layer formed over the delta-doped layer, the upper barrier layer formed of InAlAs and having an In concentration substantially equal to the In concentration of the lower barrier layer.

2. The apparatus of claim 1, wherein the concentration of In of the lower barrier layer is substantially equal to the indium concentration of the second buffer layer at the interface with the lower barrier layer.

3. The apparatus of claim 2, wherein the quantum well layer has an In concentration of greater than approximately 60%.

4. The apparatus of claim 1, wherein the second buffer layer is substantially metamorphic.

5. The apparatus of claim 1, wherein the apparatus comprises a high electron mobility transistor (HEMT), wherein the quantum well layer comprises a channel of the HEMT.

6. A method comprising:
    forming a dislocation filtering buffer formed over a silicon (Si) substrate, the dislocation filtering buffer including a first buffer layer including a gallium arsenide (GaAs) nucleation layer and a GaAs buffer layer and a second buffer layer formed on the first buffer layer, the second buffer layer comprising a graded indium aluminium arsenide (InAlAs) buffer layer;
    forming a lower barrier layer on the second buffer layer of the dislocation filtering buffer, the lower barrier layer formed of InAlAs, and forming the second buffer layer of aluminium arsenide (AlAs) at an interface with the first buffer layer and increasing concentration of indium (In) to obtain an In concentration of at least approximately 60%, and then inverse grading the second buffer layer with decreasing concentration of In to attain an In concentration of less than approximately 55% at an interface with the lower barrier layer; and
    forming a quantum well (QW) layer on the lower barrier layer, wherein the quantum well layer comprises a strained layer formed of indium gallium arsenide (InGaAs);
    forming a spacer layer over the quantum well layer;
    forming a delta-doped layer over the spacer layer; and
    forming an upper barrier layer over the delta-doped layer, the upper barrier layer formed of InAlAs and having an In concentration substantially equal to the In concentration of the lower barrier layer.

7. The method of claim 6, wherein the concentration of In of the lower barrier layer is substantially equal to the indium concentration of the second buffer layer at the interface with the lower barrier layer.

8. The method of claim 7, further comprising forming the quantum well layer with an In concentration of greater than approximately 60%.

9. The method of claim 6, further comprising forming the second buffer layer to be substantially metamorphic.

10. The method of claim 6, further comprising forming a high electron mobility transistor (HEMT) using the quantum well layer as a channel of the HEMT.

11. An apparatus comprising:
    a silicon (Si) substrate;
    a dislocation filtering buffer formed over the Si substrate, the dislocation filtering buffer including:
        a first buffer layer including a gallium arsenide (GaAs) nucleation layer to create an anti-phase domain-free virtual polar substrate and a GaAs buffer layer; and
        a second buffer layer formed on the first buffer layer, the second buffer layer comprising a graded indium aluminium arsenide (InAlAs) buffer layer;
    a lower barrier layer formed on the dislocation filtering buffer, the lower barrier layer formed of InAlAs or indium gallium aluminium arsenide (InGaAlAs); and
    a quantum well (QW) layer formed on the lower barrier layer, wherein the quantum well layer comprises a strained layer formed of indium gallium arsenide (InGaAs).

12. The apparatus of claim 11, further comprising:
    a spacer layer formed over the quantum well layer;
    a delta-doped layer formed over the spacer layer; and
    an upper barrier layer formed over the delta-doped layer, the upper barrier layer formed of InAlAs and having an In concentration substantially equal to the In concentration of the lower barrier layer.

13. The apparatus of claim 11, wherein the second buffer layer is formed of aluminium arsenide (AlAs) at an interface with the first buffer layer and is graded with increasing concentration of indium (In) to obtain an In concentration of at least approximately 60%, and is then inverse graded with decreasing concentration of In to attain an In concentration of approximately 52% at an interface with the lower barrier layer.

14. The apparatus of claim 13, wherein the second buffer layer is substantially metamorphic.

* * * * *